(12) United States Patent
Miwa et al.

(10) Patent No.: US 9,647,198 B2
(45) Date of Patent: May 9, 2017

(54) PIEZOELECTRIC ORIENTED CERAMICS AND METHOD OF MANUFACTURING THE SAME

(71) Applicants: MURATA MANUFACTURING CO., LTD., Nagaokakyo-Shi, Kyoto-fu (JP); National Institute for Materials Science, Tsukuba-shi, Ibaraki (JP)

(72) Inventors: Yasunari Miwa, Nagaokakyo (JP); Shinichiro Kawada, Nagaokakyo (JP); Masahiko Kimura, Nagaokakyo (JP); Tohru Suzuki, Tsukuba (JP); Tetsuo Uchikoshi, Tsukuba (JP); Yoshio Sakka, Tsukuba (JP)

(73) Assignees: MURATA MANUFACTURING CO., LTD., Nagaokakyo-Shi, Kyoto-Fu (JP); NATIONAL INSTITUTE FOR MATERIALS SCIENCE, Tsukuba-Shi, Ibaraki (JP)

(*) Notice: Subject to any disclaimer, the term of this patent is extended or adjusted under 35 U.S.C. 154(b) by 209 days.

(21) Appl. No.: 14/291,515

(22) Filed: May 30, 2014

(65) Prior Publication Data

US 2014/0271447 A1    Sep. 18, 2014

Related U.S. Application Data

(63) Continuation of application No. PCT/JP2012/080146, filed on Nov. 21, 2012.

(30) Foreign Application Priority Data

Dec. 12, 2011   (JP) .................................. 2011-271623

(51) Int. Cl.
*H01L 41/187* (2006.01)
*C04B 35/491* (2006.01)
(Continued)

(52) U.S. Cl.
CPC ........ *H01L 41/1876* (2013.01); *C01G 23/003* (2013.01); *C04B 35/491* (2013.01);
(Continued)

(58) Field of Classification Search
CPC .............. C01P 2006/10; C01P 2002/72; C01P 2002/34; C01P 2004/03; C01P 2004/32;
(Continued)

(56) References Cited

U.S. PATENT DOCUMENTS 5,502,345 A * 3/1996 Kahn .................. H01L 41/0926
                                                310/328
6,093,338 A    7/2000 Tani et al.
(Continued)

FOREIGN PATENT DOCUMENTS

JP   6-024840       2/1994
JP   2010-090021 A  4/2010
KR   2001-0060543   7/2001

OTHER PUBLICATIONS

Nimmo et al (NPL: "Formation of Lead Zirconate Titanate Powders by Spray pyrolysis", Journal of the American Ceramic Society 86(9):1474-1480 o Dec. 2004).*
(Continued)

*Primary Examiner* — Melvin C Mayes
*Assistant Examiner* — Smita Patel
(74) *Attorney, Agent, or Firm* — Arent Fox LLP

(57) ABSTRACT

Piezoelectric oriented ceramics containing a $Pb(Ti, Zr)O_3$-based compound having a high degree of orientation not lower than 0.64, which was calculated with the Lotgering method based on an X-ray diffraction pattern in a prescribed cross-section thereof, and having a sintered density not lower than 85% of a theoretical density.

5 Claims, 2 Drawing Sheets

(51) Int. Cl.
  *C04B 35/493* (2006.01)
  *H01L 41/43* (2013.01)
  *C01G 23/00* (2006.01)
  *C04B 35/626* (2006.01)
  *C04B 35/653* (2006.01)

(52) U.S. Cl.
  CPC ........ *C04B 35/493* (2013.01); *C04B 35/6261* (2013.01); *C04B 35/62645* (2013.01); *C04B 35/653* (2013.01); *H01L 41/43* (2013.01); *C01P 2002/34* (2013.01); *C01P 2002/72* (2013.01); *C01P 2004/03* (2013.01); *C01P 2004/32* (2013.01); *C01P 2006/10* (2013.01); *C04B 2235/3201* (2013.01); *C04B 2235/3251* (2013.01); *C04B 2235/3255* (2013.01); *C04B 2235/3279* (2013.01); *C04B 2235/444* (2013.01); *C04B 2235/5204* (2013.01); *C04B 2235/528* (2013.01); *C04B 2235/768* (2013.01); *C04B 2235/77* (2013.01); *C04B 2235/787* (2013.01)

(58) Field of Classification Search
  CPC ... H01L 41/43; H01L 41/1876; C04B 35/493; C04B 35/6261; C04B 35/62645; C04B 35/653; C04B 35/491; C04B 2235/3201; C04B 2235/3251; C04B 2235/3255; C04B 2235/32789; C04B 2235/444; C04B 2235/5204; C04B 2235/768; C04B 2235/77; C04B 2235/787; C04B 2235/528

See application file for complete search history.

(56) References Cited

U.S. PATENT DOCUMENTS

| 2006/0125352 | A1 | 6/2006 | Sakashita et al. |
| 2008/0248277 | A1* | 10/2008 | Yokoyama ............ B32B 18/00 428/220 |
| 2011/0010904 | A1* | 1/2011 | Liufu .................... H01L 41/37 29/25.35 |
| 2011/0012049 | A1 | 1/2011 | Koizumi et al. |

OTHER PUBLICATIONS

Miwa et al. "A Study of Textured PbTio3 Based Ceramics by Slip Casting in a High Magnetic Field", National Institute for Materials Science, Japan.

Miwa et al. "Textured lead Titanate Ceramics Fabricated by Slip Casting Under a High Magnetic Field" The Ceramics Society of Japan, 2011 pp. 60-64.

Miwa et al. Textured PBTio3 Based Ceramics Fabricated by Slip Casting in a High Magentic Field.

PCT/JP2012/080146 Written Opinion dated Dec. 27, 2012.

PCT/JP2012/080146 ISR PCT/JP2012/080146 Written Opinion dated Dec. 27, 2012 dated Dec. 27, 2012.

* cited by examiner

PIEZOELECTRIC ORIENTED CERAMICS AND METHOD OF MANUFACTURING THE SAME

CROSS REFERENCE TO RELATED APPLICATIONS

The present application is a continuation of International application No. PCT/JP2012/080146, filed Nov. 21, 2012, which claims priority to Japanese Patent Application No. 2011-271623, filed Dec. 12, 2011, the entire contents of each of which are incorporated herein by reference.

FIELD OF THE INVENTION

This invention relates to a piezoelectric material, and particularly to crystallographically oriented piezoelectric oriented ceramics and a method of manufacturing the same.

BACKGROUND OF THE INVENTION

Piezoelectric oriented ceramics having a perovskite structure has conventionally been employed as a dielectric material or a piezoelectric material. It has been known that electrical characteristics of the piezoelectric oriented ceramics having such a perovskite structure are improved by orienting crystals thereof.

For example, a technique described in PTD 1 has been proposed as a method of fabricating piezoelectric oriented ceramics having a perovskite structure. With the technique described in PTD 1, piezoelectric oriented ceramics high in crystal orientation is obtained by forming slurry containing a perovskite structure compound mainly composed, for example, of $PbTiO_3$ in magnetic field to thereby fabricate a ceramic compact and firing the fabricated compact.

PTD 1: Japanese Patent Laying-Open No. 2010-090021

SUMMARY OF THE INVENTION

When the manufacturing method described in PTD 1 is applied to fabrication of piezoelectric oriented ceramics containing lead zirconate titanate (hereinafter referred to as a $Pb(Ti, Zr)O_3$-based compound), however, in a sintering process, crystal orientation is lost and hence piezoelectric oriented ceramics containing a $Pb(Ti, Zr)O_3$-based compound could not be obtained. The reason may be because a $Pb(Ti, Zr)O_3$-based compound contains two types of elements occupying a B site of an $ABO_3$-type crystal and hence mutual diffusion of Ti and Zr during a sintering process significantly disturbs a crystal state, which results in loss of crystal orientation.

Therefore, a primary object of this invention is to provide piezoelectric oriented ceramics which is mainly composed of a $Pb(Ti, Zr)O_3$-based compound as a compound having a perovskite structure and has high crystal orientation and a method of manufacturing the same.

Piezoelectric oriented ceramics according to this invention mainly composed of a $Pb(Ti, Zr)O_3$-based compound having a perovskite structure has a degree of orientation not lower than 0.64, which is calculated with the Lotgering method based on an X-ray diffraction pattern in a prescribed cross-section thereof, and has sintered density not lower than 85% of theoretical density.

The piezoelectric oriented ceramics according to this invention is preferably formed of spherical particles.

A method of manufacturing piezoelectric oriented ceramics according to this invention having a degree of orientation not lower than 0.64, which is calculated with the Lotgering method based on an X-ray diffraction pattern in a prescribed cross-section thereof, includes the steps of preparing single crystal powders containing a $Pb(Ti, Zr)O_3$-based compound having a perovskite structure, fabricating slurry containing the single crystal powders as a dispersion phase, obtaining a compact by forming the slurry in magnetic field, and firing the compact, and in the step of firing the compact, the compact is held and fired for 24 hours or longer at a temperature lower by at least 100° C. than a firing temperature lowest among firing temperatures at which sintered density is not lower than 85% of theoretical density in a case of firing under such a condition that a time period for holding a firing temperature is set to 3 hours.

According to the piezoelectric oriented ceramics in this invention, piezoelectric oriented ceramics mainly composed of a $Pb(Ti, Zr)O_3$-based compound and having high crystal orientation and high sintered density can be obtained.

The reason why even piezoelectric oriented ceramics containing a $Pb(Ti, Zr)O_3$-based compound does not lose crystal orientation can be estimated as follows. Namely, it is estimated that, by suppressing a firing temperature and extending a time period for firing in the step of firing the compact containing the $Pb(Ti, Zr)O_3$-based compound, while disturbance of a crystal state due to mutual diffusion of Ti and Zr too abrupt to lose crystal orientation is suppressed, mass transfer sufficient for sintering can be brought about.

The foregoing and other objects, features, and advantages of this invention will become more apparent from the following description of an embodiment for carrying out the invention provided with reference to the drawings.

DETAILED DESCRIPTION OF THE PREFERRED EMBODIMENTS

Figure 1:
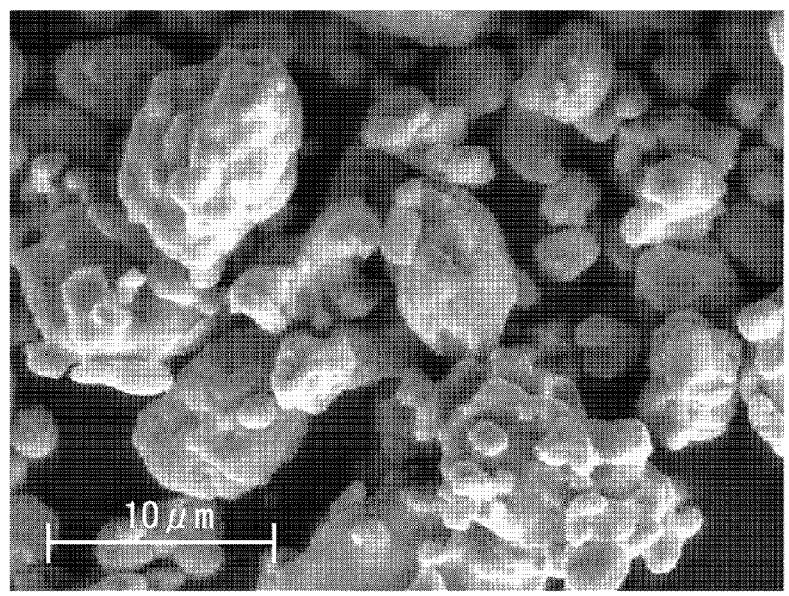
FIG. 1 shows an SEM image of $Pb(Ti_{0.7}Zr_{0.3})O_3$ particles according to sample 1 fabricated in an experimental example.

One embodiment of piezoelectric oriented ceramics and a method of manufacturing the same according to the present invention will be described.

(Piezoelectric Oriented Ceramics)

Piezoelectric oriented ceramics according to the present invention is mainly composed of a $Pb(Ti, Zr)O_3$-based compound having a perovskite structure. Particles forming this piezoelectric oriented ceramics are preferably spherical. This is because, when particles forming piezoelectric oriented ceramics are spherical, generation or development of a crack is less likely.

The piezoelectric oriented ceramics according to the present invention has a degree of orientation of a first axis not lower than 0.64, which is calculated with the Lotgering method based on an X-ray Diffraction (XRD) pattern in a prescribed cross-section thereof, and has high crystal orientation. The Lotgering method will be described in detail later.

The piezoelectric oriented ceramics according to the present invention has sintered density not lower than 85% of theoretical density thereof. Theoretical density is calculated, for example, from a size of a unit cell found by analyzing results of measurement with the X-ray diffraction method and an atomic weight. It is noted that this theoretical density $\rho_{theo}$ is represented in the following expression (1):

$$\rho_{theo} = W_{unit}/V_{unit} \quad (1)$$

where $W_{unit}$ represents a weight per unit cell and $V_{unit}$ represents a volume per unit cell.

Therefore, the piezoelectric oriented ceramics according to the present invention is mainly composed of a Pb(Ti, Zr)O$_3$-based compound high in crystal orientation of one of three crystal axes of ceramic particles.

(Method of Manufacturing Piezoelectric Oriented Ceramics)

An embodiment of a method of manufacturing piezoelectric oriented ceramics according to the present invention will now be described.

In order to manufacture piezoelectric oriented ceramics according to the present invention, powders containing a Pb(Ti, Zr)O$_3$-based compound having a perovskite structure are prepared. In order to prepare the powders containing the Pb(Ti, Zr)O$_3$-based compound, for example, source materials such as PbO, TiO$_2$, and ZrO$_2$ are wet-mixed, followed by drying by calcination, so that a calcined product of the Pb(Ti, Zr)O$_3$-based compound is fabricated. Then, this calcined product is dry-crushed to fabricate calcined powders. In succession, these calcined powders are subjected to heat treatment in flux. Thus, a crystal of a perovskite structure compound is grown, to prepare single crystal powders containing the Pb(Ti, Zr)O$_3$-based compound. It is noted that these single crystal particles are spherical. At least one of KCl and NaCl is advantageously employed as the flux.

In succession, slurry containing the single crystal powders prepared with the method above is fabricated as a dispersion phase. Then, the fabricated slurry is formed in magnetic field, to thereby obtain a compact. By thus forming slurry in magnetic field, an axis of a crystal contained in the compact is oriented in a prescribed direction in accordance with applied magnetic field.

Then, the compact manufactured with the method above is fired to thereby obtain piezoelectric oriented ceramics. Initially, the compact is held and fired for 24 hours or longer at a temperature lower by at least 100° C. than a firing temperature lowest among firing temperatures at which sintered density is not lower than 85% of theoretical density in a case that the compact is fired under such a condition that a time period for holding a firing temperature is set to 3 hours.

Namely, when a compact is fired under such a condition that a time period for holding a firing temperature is set to 3 hours, a firing temperature at which sintered density of 85% of theoretical density is obtained is from 1100 to 1150° C. Therefore, desired piezoelectric oriented ceramics can be fabricated by holding and firing the compact for 24 hours or longer at 1000° C. which is lower by at least 100° C. than the firing temperature. It is noted that the temperature for thus holding for 24 hours or longer is preferably not lower than 950° C. and not higher than 1000° C.

According to the method of manufacturing piezoelectric oriented ceramics in the present invention, a sintered object of piezoelectric oriented ceramics containing a Pb(Ti, Zr)O$_3$-based compound as a compound having a perovskite structure, which has a degree of orientation of the first axis not lower than 0.64, which is calculated with the Lotgering method based on an X-ray diffraction (XRD) pattern in a prescribed cross-section of the piezoelectric oriented ceramics, can be obtained.

An experimental example conducted for confirming an effect of the method of manufacturing piezoelectric oriented ceramics according to the present invention and piezoelectric oriented ceramics fabricated with the manufacturing method will be described below.

1. Fabrication of Sample (Sample 1)

Sample 1 was fabricated with a fabrication method described below.

PbO, TiO$_2$, and ZrO$_2$ were weighed such that a molar ratio among Pb, Ti, and Zr was set to 1:0.7:0.3 and they were wet-mixed in a ball mill for 15 hours, followed by drying by calcination at 900° C. Thus, a calcined product of Pb(Ti$_{0.7}$Zr$_{0.3}$)O$_3$ was obtained.

In succession, the obtained calcined product was dry-crushed and mixed with KCl such that a weight ratio was set to 1:1. This mixture was subjected to heat treatment in an alumina crucible at 1000° C. for 12 hours, followed by cooling to a room temperature. Then, KCl was dissolved in water and removed, followed by drying. Pb(Ti$_{0.7}$Zr$_{0.3}$)O$_3$ grown as crystal to particles formed of single crystal was thus obtained. Here, FIG. 1 shows an SEM image of resultant Pb(Ti$_{0.7}$Zr$_{0.3}$)O$_3$ crystal particles. As shown in FIG. 1, crystal particles of Pb(Ti$_{0.7}$Zr$_{0.3}$)O$_3$ are spherical.

Then, 30 g of Pb(Ti$_{0.7}$Zr$_{0.3}$)O$_3$ particles grown as crystal was taken. To 100 parts by weight of these Pb(Ti$_{0.7}$Zr$_{0.3}$)O$_3$ particles, 0.5 part by weight of polyvinyl alcohol and 40 parts by weight of pure water were added, and they were mixed in a ball mill for 12 hours, to thereby obtain slurry.

Then, the resultant slurry was molded in magnetic field of 12T, and a compact in which crystals were oriented was obtained. The resultant compact was fired under such a condition that a time period for holding a firing temperature was set to 3 hours, with a firing temperature being varied by 50° C. between 1000° C. and 1200° C. Five sintered objects in total at respective firing temperatures were thus obtained.

Figure 2:
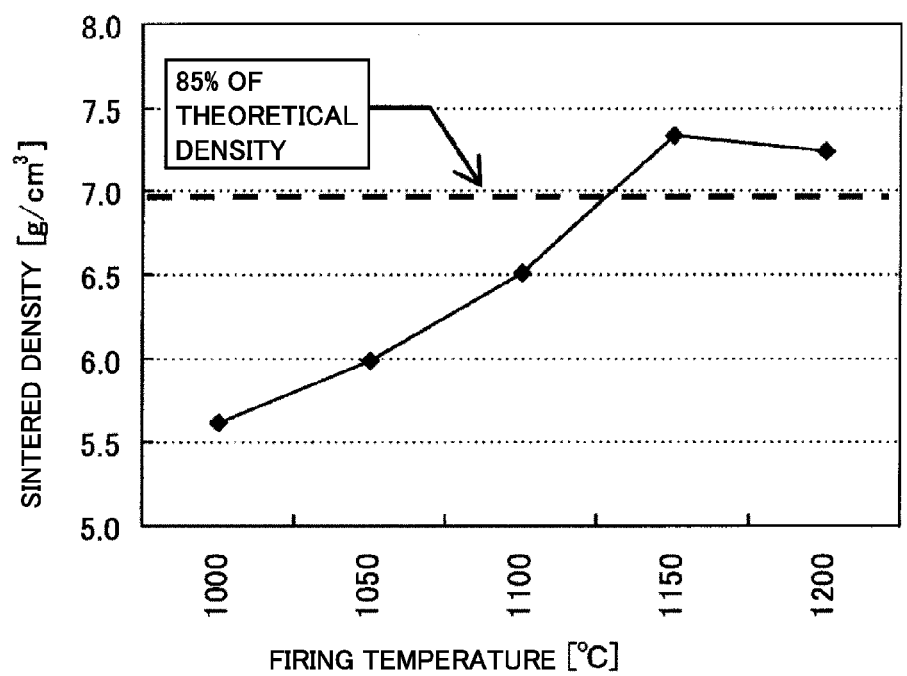
FIG. 2 is a diagram showing sintered density corresponding to each firing temperature of a sintered object of piezoelectric oriented ceramics fired under a condition of holding for 3 hours with a firing temperature being varied, in the step of firing piezoelectric oriented ceramics.
Figure 3:
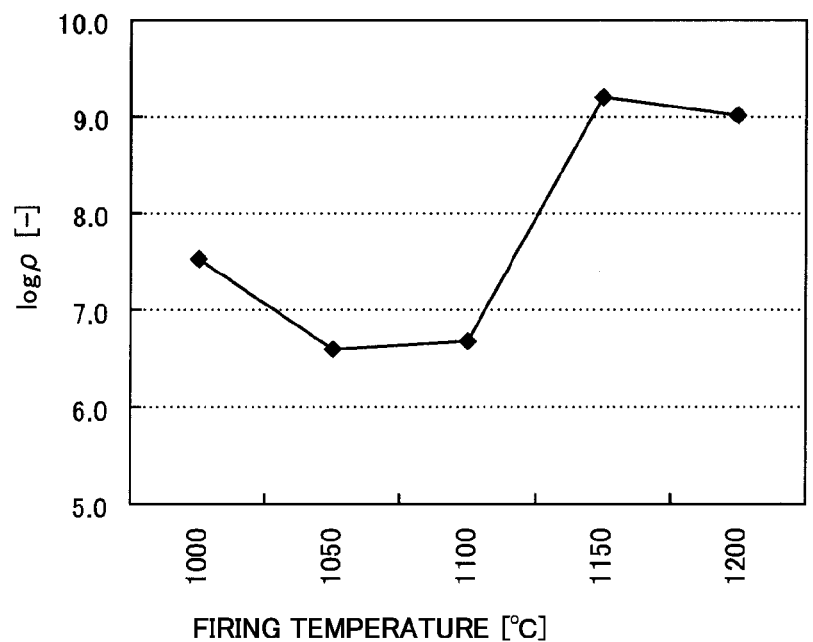
FIG. 3 is a diagram showing specific resistance $\rho$ of the sintered object of piezoelectric oriented ceramics obtained for each firing temperature.

Here, sintered density of each sintered object obtained by varying a firing temperature was measured, and results in FIG. 2 were obtained. It is noted that 85% of theoretical density is shown with a dashed line in FIG. 2. FIG. 3 shows specific resistance ρ of each sintered object obtained by varying a firing temperature. Here, though specific resistance ρ is desirably not lower than 1.0×10$^8$ Ωm in terms of polarization treatment, it was clear from FIG. 2 that sintered density should be not lower than 85% of theoretical density for a sintered object having necessary specific resistance ρ in FIG. 3. In addition, it was clear from FIG. 2 that a firing temperature at which sintered density of 85% of theoretical density is obtained was between 1100 and 1150° C.

It is noted that sintered density of each sintered object obtained for each firing temperature above was measured with the Archimedean method. Theoretical density was 8.05 g/cm$^3$. Namely, by analyzing results of measurement with the X-ray diffraction method, $V_{unit}$ representing a volume per unit cell was 6.52×10$^{-23}$ cm$^3$ and $W_{unit}$ representing a weight per unit cell was 5.25×10$^{-22}$ g, and hence theoretical density was calculated from the expression (1) based thereon. Specific resistance ρ of each sintered object was calculated by applying a DC voltage of 100 V to each sintered object for precharging for 15 seconds and thereafter measuring a current which flows through each sintered object.

By holding and firing the compact obtained with the method described above for 24 hours at 1000° C. based on the results in FIGS. 2 and 3, a sintered object (sample 1) was obtained.

(Sample 2)

Sample 2 was fabricated with a fabrication method described below.

PbO, TiO$_2$, and ZrO$_2$ were weighed such that a molar ratio among Pb, Ti, and Zr was set to 1:0.7:0.3 and they were wet-mixed in a ball mill for 15 hours, followed by drying by calcination at 900° C. Thus, a calcined product of Pb(Ti$_{0.7}$Zr$_{0.3}$)O$_3$ was obtained.

In succession, the obtained calcined product was dry-crushed and mixed with KCl such that a weight ratio was set to 1:1. This mixture was subjected to heat treatment in an alumina crucible at 1000° C. for 12 hours, followed by cooling to a room temperature. Then, KCl was dissolved in water and removed, followed by drying. Pb(Ti$_{0.7}$Zr$_{0.3}$)O$_3$ grown as crystal to single crystal particles was thus obtained.

Then, 30 g of Pb(Ti$_{0.7}$Zr$_{0.3}$)O$_3$ particles grown as crystal, which were obtained with the method described above, was taken. To 100 parts by weight of these Pb(Ti$_{0.7}$Zr$_{0.3}$)O$_3$ particles, 0.5 part by weight of polyvinyl alcohol and 40 parts by weight of pure water were added and they were mixed in a ball mill for 12 hours, to thereby obtain slurry.

Then, the resultant slurry was molded in magnetic field of 12T, and a compact in which crystals were oriented was obtained. This compact was held and fired at 1150° C. for 3 hours to thereby obtain a sintered object (sample 2).

(Sample 3)

Sample 3 was fabricated with a fabrication method described below.

PbO, TiO$_2$, and ZrO$_2$ were weighed such that a molar ratio among Pb, Ti, and Zr was set to 1:0.7:0.3 and they were wet-mixed in a ball mill for 15 hours, followed by drying by calcination at 900° C. Thus, a calcined product of Pb(Ti$_{0.7}$Zr$_{0.3}$)O$_3$ was obtained.

In succession, the obtained calcined product was dry-crushed and mixed with KCl such that a weight ratio was set to 1:1. This mixture was subjected to heat treatment in an alumina crucible at 1000° C. for 12 hours, followed by cooling to a room temperature. Then, KCl was dissolved in water and removed, followed by drying. Pb(Ti$_{0.7}$Zr$_{0.3}$)O$_3$ grown as crystal to single crystal particles was thus obtained.

Then, 30 g of Pb(Ti$_{0.7}$Zr$_{0.3}$)O$_3$ particles grown as crystal, which were obtained with the method described above, was taken. To 100 parts by weight of these Pb(Ti$_{0.7}$Zr$_{0.3}$)O$_3$ particles, 0.5 part by weight of polyvinyl alcohol and 40 parts by weight of pure water were added and they were mixed in a ball mill for 12 hours, to thereby obtain slurry.

Then, the resultant slurry was molded in magnetic field of 12T, and a compact in which crystals were oriented was obtained. This compact was held and fired at 1000° C. for 3 hours, to thereby obtain a sintered object (sample 3).

2. Evaluation

Then, a degree of orientation in a prescribed cross-section of a sintered object of each sample obtained with the fabrication method described above was calculated from the following expression (2) with the Lotgering method. In calculation of the degree of orientation, a sintered object of Pb(Ti, Zr)O$_3$ obtained by firing a compact formed without application of magnetic field was employed as a reference sample.

$$\text{Degree of Orientation } F = \frac{\frac{\Sigma I(HKL)}{\Sigma I(hkl)} - \frac{\Sigma I_0(HKL)}{\Sigma I_0(hkl)}}{1 - \frac{\Sigma I_0(HKL)}{\Sigma I_0(hkl)}} \times 100 \quad \text{Expression 2}$$

Here, $\Sigma I(HKL)$ represents the total sum of X-ray peak intensities of specific crystal planes (HKL) of a sintered object to be evaluated and $\Sigma I(hkl)$ is the total sum of X-ray peak intensities of all crystal planes (hkl) of a sintered object to be evaluated. $\Sigma I_0(HKL)$ represents the total sum of X-ray peak intensities of specific crystal planes (HKL) of the reference sample, and $\Sigma I_0(hkl)$ represents the total sum of X-ray peak intensities of all crystal planes (hkl) of the reference sample.

A measurement condition was set to 2θ=20 to 60 deg. Intensities at <100>, <110>, <111>, <200>, <210>, and <211> were employed as intensities of X-ray peaks of all crystal planes (hkl). Intensities at <100> and <200> were employed as specific crystal planes (HKL).

Sintered density of the sintered objects of sample 1 to sample 3 was measured with the method described above.

Figure 4:
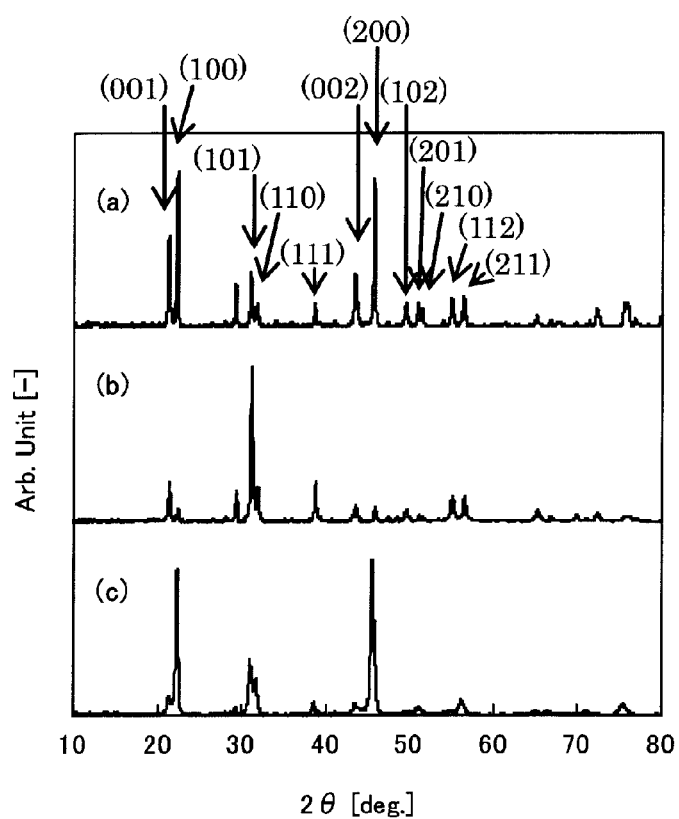
FIG. 4 shows an XRD chart in a prescribed cross-section of the sintered object of the piezoelectric oriented ceramics, with (a) showing an XRD chart of sample 1, (b) showing an XRD chart of sample 2, and (c) showing an XRD chart of sample 3.

Table 1 shows results of a degree of orientation, sintered density, and specific resistance ρ of the sintered objects of obtained sample 1 to sample 3, together with a firing condition for each sample. FIG. 4 shows an XRD chart in a prescribed cross-section of a sintered object of piezoelectric oriented ceramics, with (a) showing an XRD chart of sample 1, (b) showing an XRD chart of sample 2, and (c) showing an XRD chart of sample 3. It is noted that specific resistance ρ of each sample was calculated by applying a DC voltage of 100 V to each sample for precharging for 15 seconds and thereafter measuring a current which flowed through the sample.

TABLE 1

| Sample | Sample 1 | Sample 2* | Sample 3* |
|---|---|---|---|
| Firing Condition | 1000° C., 24 hr | 1150° C., 3 hr | 1000° C., 3 hr |
| Degree of Orientation | 64% | 25% | 70% |
| Sintered Density | 7.2 g/cm$^3$ | 7.4 g/cm$^3$ | 5.6 g/cm$^3$ |
| Specific Resistance ρ | 8.1 × 10$^8$ Ωm | 1.6 × 10$^9$ Ωm | 3.4 × 10$^7$ Ωm |

*in the table indicates out of the range of the present invention.

In Table 1, sample 1 was high in degree of orientation and achieved a high value of sintered density with respect to theoretical density. It can be seen that, though sample 2 achieved a high value of sintered density with respect to theoretical density similarly to sample 1, a degree of orientation of the obtained sintered object was low. It can be seen that, though sample 3 was high in degree of orientation, sintered density was low with respect to theoretical density. Furthermore, although specific resistance ρ not lower than 1.0×10$^8$ Ωm is desirable in terms of polarization treatment, it can be seen that sample 3 does not satisfy such a condition.

According to the method of manufacturing piezoelectric oriented ceramics in the present invention, piezoelectric oriented ceramics containing a Pb(Ti, Zr)O$_3$-based compound and having high crystal orientation can be obtained by holding and firing a compact for 24 hours or longer at a temperature lower by at least 100° C. than a firing temperature lowest among firing temperatures at which sintered density is not lower than 85% of theoretical density in a case that the compact is fired under such a condition that a time period for holding a firing temperature is set to 3 hours in the step of firing the compact containing the Pb(Ti, Zr)O$_3$-based compound.

Though the embodiment according to the present invention is directed to piezoelectric oriented ceramics mainly composed of a PZT-based compound which is a Pb(Ti, Zr)O$_3$-based compound, the embodiment is not limited thereto, and the method of manufacturing piezoelectric oriented ceramics according to the present invention may be applied also to fabrication of piezoelectric oriented ceramics containing a Pb{(Ni, Nb), Ti, Zr)O$_3$-based compound containing, in addition to this PZT-based compound, Pb(Ni, Nb)O$_3$ as a third component.

The invention claimed is:

1. Piezoelectric oriented ceramics mainly composed of a Pb(Ti,Zr)O$_3$-based compound having a perovskite structure, having a degree of orientation not lower than 0.64, which is calculated with Lotgering method based on an X-ray diffraction pattern in a prescribed cross-section thereof, and having a sintered density not lower than 85% of a theoretical density, wherein single crystal particles forming said piezoelectric oriented ceramics are spherical.

2. The piezoelectric oriented ceramics according to claim 1, wherein said piezoelectric oriented ceramics have a specific resistance not lower than $1.0 \times 10^8$ Ωm.

3. A method of manufacturing piezoelectric oriented ceramics having a degree of orientation not lower than 0.64, which is calculated with Lotgering method based on an X-ray diffraction pattern in a prescribed cross-section thereof, the method comprising:
preparing single crystal powders containing a Pb(Ti,Zr)O$_3$-based compound having a perovskite structure;
fabricating a slurry containing said single crystal powders as a dispersion phase;
obtaining a compact by forming said slurry in a magnetic field; and
firing said compact for 24 hours or longer at a temperature lower by at least 100° C. than a firing temperature at which a sintered density is not lower than 85% of a theoretical density when firing for 3 hours;
wherein single crystal particles forming said piezoelectric oriented ceramics are spherical.

4. The method of manufacturing piezoelectric oriented ceramics according to claim 3, wherein the temperature is not lower than 950° C. and not higher than 1000° C.

5. The method of manufacturing piezoelectric oriented ceramics according to claim 3, wherein the magnetic field is 12T.

* * * * *